United States Patent [19]
Chaw

[11] Patent Number: 5,781,037
[45] Date of Patent: Jul. 14, 1998

[54] METHOD AND APPARATUS FOR AN ADDRESS TRANSITION DETECTION CIRCUIT

[75] Inventor: Steve Chaw, Hsin Ying, Taiwan

[73] Assignee: United Microelectronics, Inc., Taiwan

[21] Appl. No.: 683,459

[22] Filed: Jul. 18, 1996

[51] Int. Cl.[6] .............................. G01R 19/00; H03K 5/19
[52] U.S. Cl. ................................................ 327/18; 327/31
[58] Field of Search ............................ 327/18–21, 26, 327/31, 34, 36, 38, 108, 109, 112, 161, 291, 292, 276, 277, 278, 280, 281, 284, 389; 326/98; 365/233.5, 233

[56] References Cited

U.S. PATENT DOCUMENTS

| | | | |
|---|---|---|---|
| 4,692,637 | 9/1987 | Shoji | 327/292 |
| 4,728,820 | 3/1988 | Lee | 326/31 |
| 5,424,661 | 6/1995 | Lin et al. | 327/18 |
| 5,493,538 | 2/1996 | Bergman | 327/26 |
| 5,604,455 | 2/1997 | Bion et al. | 327/276 |
| 5,623,218 | 4/1997 | Kim | 327/18 |

FOREIGN PATENT DOCUMENTS

| | | | |
|---|---|---|---|
| 358205329 | 11/1983 | Japan | 327/2 |
| 3740362 | 6/1988 | Japan | 327/18 |
| 401101725 | 4/1989 | Japan | 327/18 |

Primary Examiner—My-Trang Nu Ton

[57] ABSTRACT

The present invention relates to an improvement to an address transition detection (ATD) circuit in an IC chip, a method related to the improved ATD circuit is also disclosed. The improved ATD circuit applies a transfer gate and a lot of inverters to construct a new ATD circuit. Not only reduces power dissipation while an address transition is detecting, but less consumption on transistors is achieved. Each time when the logic state of an input pin is switching, the improved ATD circuit generates an inverting phase signal based on the switching; next, a transfer gate generates a driving signal for waking up the chip from idleness; a delaying circuit then generates a regular time interval for the chip to operate the task indicated by the varied address. At the end of the regular time interval, the chip returns to idleness again to wait another job's coming.

15 Claims, 8 Drawing Sheets

METHOD AND APPARATUS FOR AN ADDRESS TRANSITION DETECTION CIRCUIT

BACKGROUND OF THE INVENTION

1. Field of the Invention

The present invention relates to an address transition detection circuit, and more particularly to a system for reducing power dissipation of a chip each time when the state of an input pin is changing, and furthermore, applying fewer transistors on a chip without losing accuracy and speed of the system.

2. Description of the Prior Art

The present invention relates to an address transition detection (to be referred to "ATD" hereinafter) circuit that consumes less power while driving a chip from idleness, and fewer transistors in building the ATD circuit.

Power dissipation is an important topic of IC technologies. Every one skilled in the art wants to produce a chip with less power dissipation. It is a tendency that a chip consumes little power when the states of input pins of the chip (to be referred to "the address of the chip" hereinafter) keep the same, which is commonly referred to as a "sleep mode". Each time when an address is changing, an ATD circuit of the chip tests this change and "wakes up" the chip from sleep mode for processing the operations indicated by the address.

The operation of the ATD circuit is to detect whether the address of a chip is transiting or not. While an input pin is switching its state (whether the state is changing from logic 0 to logic 1 or from logic 0 to logic 1), the ATD circuit is capable of detecting this switching and then generating a driving signal to wake up the chip from sleeping. The chip will keep wakefully in a regular time interval for operating the specific task indicated by the address where the regular time interval is varying based on the necessity of the specific task. At the end of the regular time interval, the chip returns to sleep mode and waits for another address' transition, or, another task's coming.

The ATD circuit needs to consume power while waking up a sleeping chip. FIG. 1 describes a conventional ATD circuit, which consumes a great deal of DC current. Furthermore, too many transistors used in constructing such a conventional ATD circuit occupy a lot of space and increase the size of a chip. The present invention discloses an improved method and apparatus for overcoming these disadvantages.

SUMMARY OF THE INVENTION

The principal object of the present invention is to provide an ATD circuit to be capable of efficiently reducing power dissipation while detecting a transition of an address to a chip.

The other object of the present invention is to provide a skill to construct an ATD circuit with fewer transistors but maintain the similar detecting speed and performance.

The improved ATD circuit according to present invention is composed of delay circuit, a transfer gate, and a lot of inverters to behave as an edge trigger generator. All improvements to a traditional ATD circuit are completing after combining a widespread use of NOR plane. Not only are fewer transistors used in constructing an ATD, but less power dissipation is consumed in practice.

In operations, the improved ATD circuit first generates an inverting phase signal by reversing the phase of each input signal of an address. The transfer gate receives both the input signal and the inverting phase signal and generates at driving signal. While the state of an input pin is changing, the driving signal will drive the NOR plane to wake up the chip from idleness. The chip is wakeful in an operating period to process the task indicated by the address. At the end of the operating period, the chip returns to idleness and waits for another task's coming.

BRIEF DESCRIPTION OF THE DRAWINGS

Preferred embodiments of the invention will now be described in connection with the accompanying drawings, in which.

DESCRIPTION OF THE PREFERRED EMBODIMENT

A preferred embodiment of the present invention will be described hereinafter.

Figure 1:
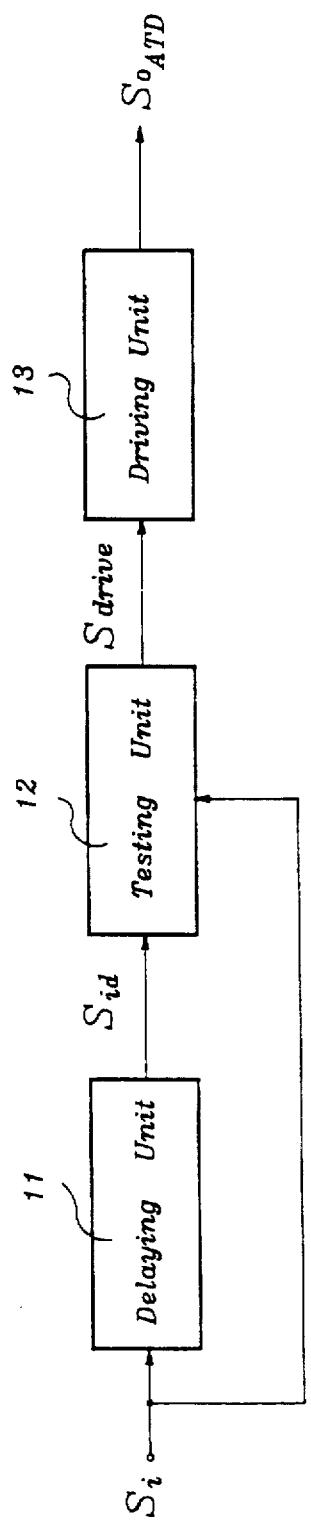
FIG. 1 represents the block diagram of a conventional ATD circuit.

The block diagram of a conventional ATD circuit in an input pin of a chip is described in FIG. 1. There are 3 basic units in the conventional ATD circuit: a delaying unit 11 receiving an input signal Si from an input pin of a chip, and providing a delayed input signal $Si_d$ based on Si; a testing unit 12 receiving the delayed input signal $Si_d$, and generating a driving signal $S_{drive}$; and a driving unit 13 receiving the driving signal $S_{drive}$ and providing a final output $So_{ATD}$ to drive the chip from idleness.

Figure 2:
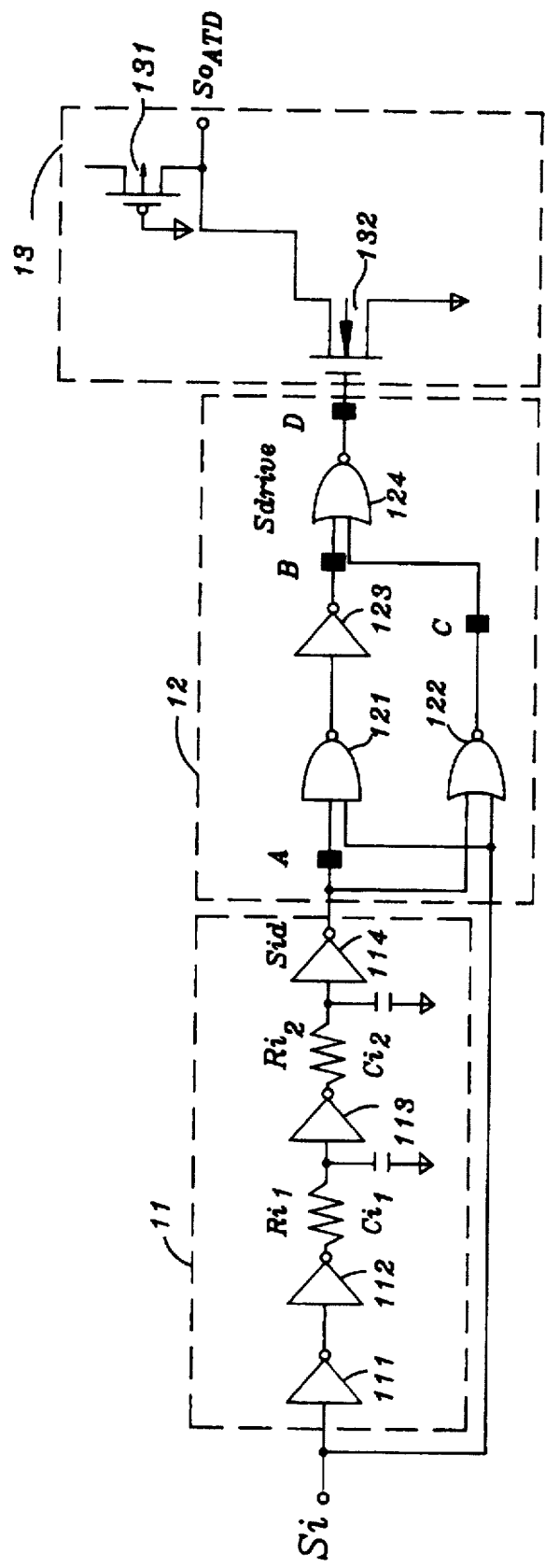
FIG. 2 represents the circuit diagram of the conventional ATD circuit according to FIG. 1.

FIG. 2 shows the circuit diagram of the conventional ATD circuit according to FIG. 1. It is clear that the delaying unit 11 is a conventional delaying circuit composed of 4 inverters 111, 112, 113, and 114, 2 resistors $Ri_1$ and $Ri_2$, an 2 capacitors $Ci_1$ and $Ci_2$. The configuration of resistors $Ri_1$ and $Ri_2$, and capacitors $Ci_1$ and $Ci_2$ is 2 R-C circuit to delay Si. All skilled in the art know that a capacitor costs a lot of time to charge and/or discharge, this characteristic is comprehensively applied in a delaying circuit. The testing unit 12 is composed of a NAND gate 121, 2 NOR gates 122 and 124, and a CMOS inverter 123. Check points A ($Si_d$), B, C, and D ($S_{drive}$) are also chosen for showing their current logic states. Driving unit 13 is composed of a PMOS transistor 131 and an NMOS transistor 132. The transistor 131 is an active load of transistor 132 by coupling the drain of the transistor 131 to the drain of the transistor 132. The configuration of the driving unit 13 is a NOR plane. All input pins can share the same NOR plane by sharing the same active load (transistor 131) and provide $So_{ATD}$ to wake up a chip from sleeping each time while an input pin switches its state.

Figure 3:
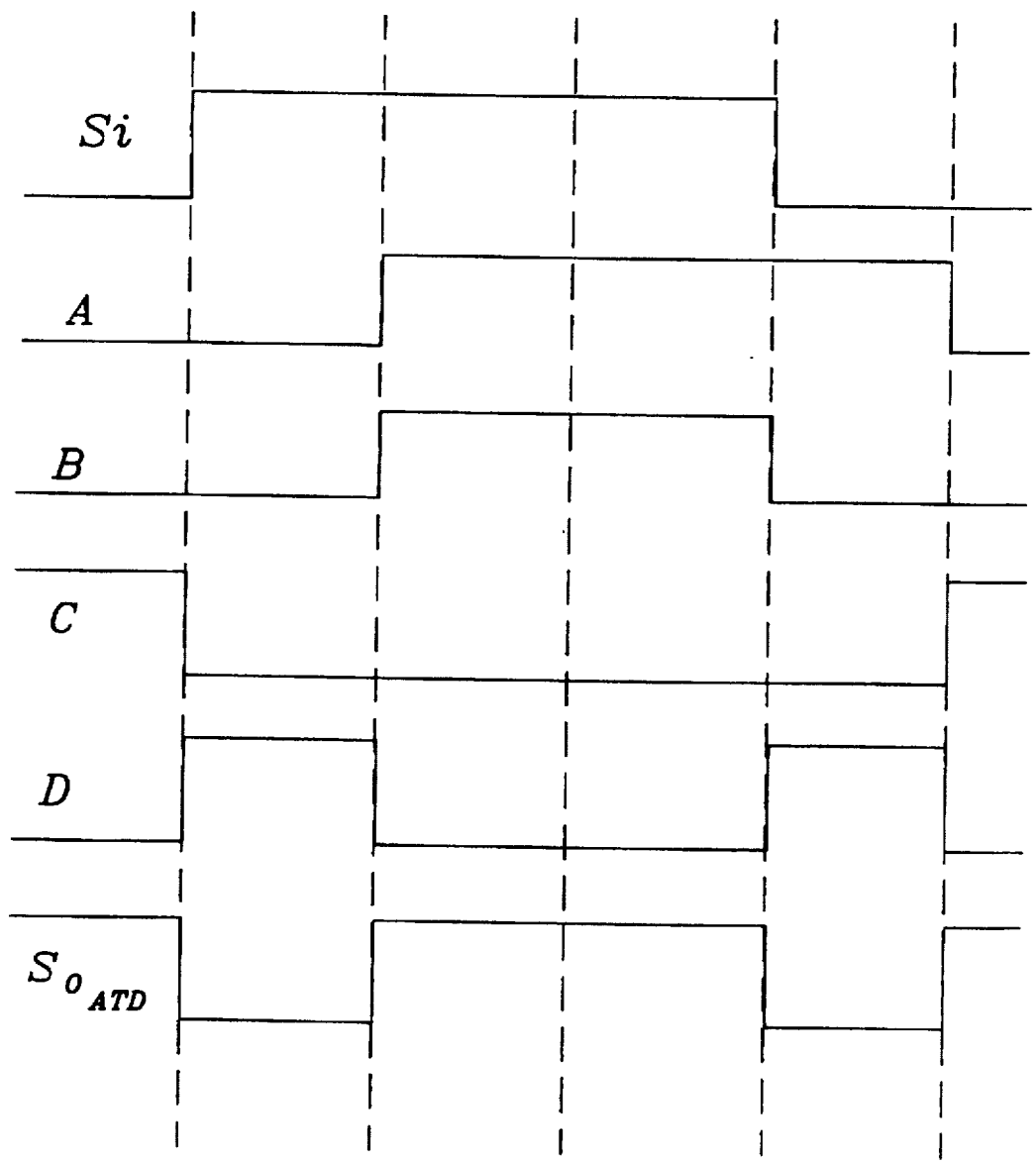
FIG. 3 represents the waveform diagram while a transition appears in a bit of an address according to the conventional ATD circuit in FIG. 1.

FIG. 3 represents the waveform of the conventional ATD circuit according to FIG. 2. It simply describes the variation of an input pin Si on a chip. Hereinafter, a positive logic is following for describing the following waveform. That is, the high voltage level is defined as logic 1 (referring to "high" for short) and the low voltage level represents logic 0 (referring to "low" for short). The initial state of Si is low, the state of the point A, the point B and the point D are assumed low, but both the point C and the final output $So_{ATD}$ are assumed high.

When Si switches its state to high, both the points A and B still remain on low but the point D transits its state to high, and the point C drops from high to low at the same time. The delaying unit 11 delays Si in a regular time interval (define this interval as an operating period) to keep the state of the point A remaining on low until the end of the operating period. The point B is also low by the effecting of the delaying unit 11. A branch by passes the delaying unit 11 to affect the states of the points B, C, and D immediately. The state of the point B still remains on low because point A is low. The point C drops to low because the output of the NOR gate 122 is low, and the point D is high because the output of NOR gate 124 is high. The transistor 132 is turned on by the high state of the point D, while the final output $So_{ATD}$ drops to low for waking up the chip from idleness to process the operations indicated by the varied address.

At the end of the operating period, the state of the point A turns to high and also does the point B. The point C still remains on low but the point D drops from high to low, and the transistor 132 is cut off by the low state of the point D at the same time. Thus, the state of the final output $So_{ATD}$ is pulled to high, terminating the operations of the task indicating by the varied address. The chip then goes idleness to wait another address transition, or, another task' coming.

Another operating period starts when Si returns to low. The state of the point A still remains on high and the point C is still low, but the point B drops to low. The point D turns to high to indicate a happening to an address transition. The transistor 132 is turned on by the high state of the point D, and the final output $So_{ATD}$ drops to low to wake up the chip from sleeping once again. The chip also keeps wakefully in the operating period to process the task indicated by the varied address. At the end of the operating period, the state of the point A and point D drop to low, the point B is still on low, but the point C is pulling to high. After the transistor 132 is cut off again by the low state of point D, the final output $So_{ATD}$ turns to high to terminate the operating period and the operations of the task indicated by the address. The chip then goes idleness to wait another address transition. Obviously, it is possible that several input pins of a chip can switch their states simultaneously. However, the final output $So_{ATD}$ is still low even there are several driving signal $S_{drive}$ routing to the NOR plane but more transistors are turned on.

It seems that too much power dissipation is consumed and too many transistors are used in constructing such a conventional ATD circuit. There are at least 3 positions where DC current is consumed: the first inverter 111 of the delaying unit 11, and the NAND gate 121 and the NOR gate 122 connecting directly with the delaying unit 11. In addition, 14 transistors are used in constructing the testing unit 12 (a NAND gate contains 4 MOS transistors and so does a NOR gate, and 2 MOS transistors in a CMOS inverter).The present invention suggests an improvement to these disadvantages mentioned above.

Figure 4:
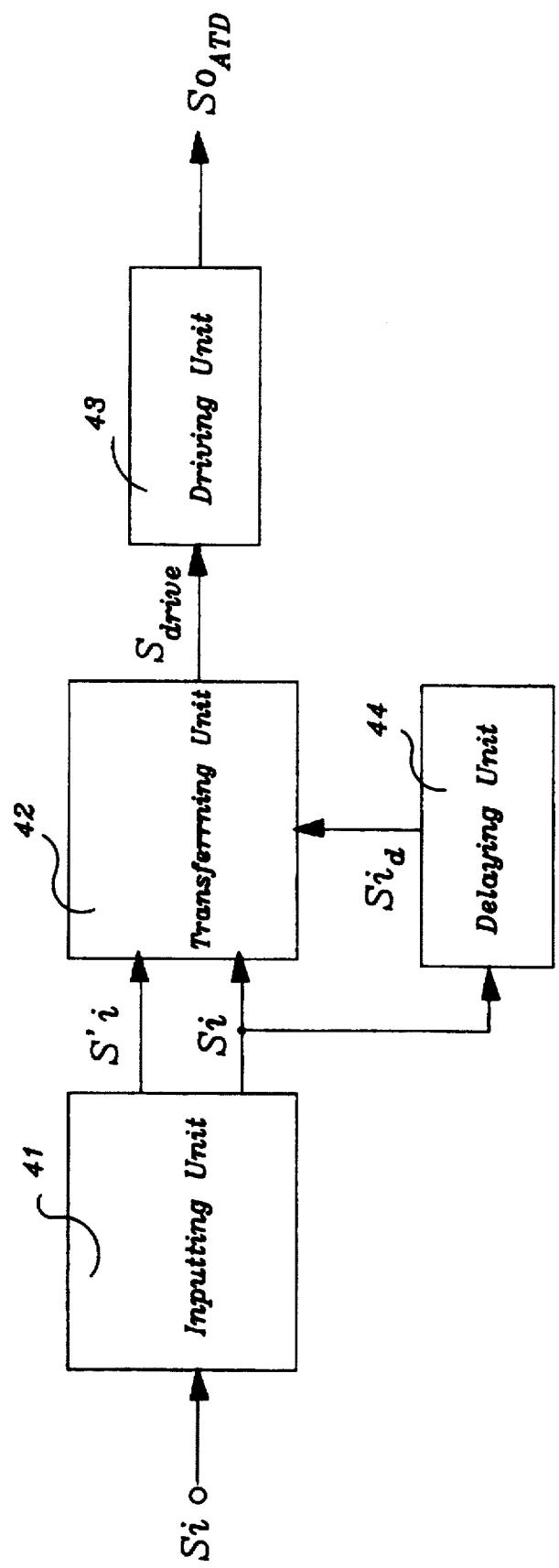
FIG. 4 represents the block diagram of an improved ATD) circuit according to the present invention.

FIG. 4 represents a block diagram of the present invention. It detects the variation of an input pin Si on a chip. There are 4 basic elements in this diagram: inputting unit 41 for receiving the input signal Si from an input pin, providing Si and generating an inverting phase signal Si', which has the same characteristics with the input signal Si but the phase is inverted; delaying unit 44 for delaying Si, and generating a delayed signal $Si_d$ according to Si; transferring unit 42 for receiving the input signal Si, the inverting signal Si', and the delayed signal $Si_d$, and generating a driving, signal $S_{drive}$; and driving unit 43 for receiving the driving signal $S_{drive}$ and generating a final output $So_{ATD}$ to wake up the chip from idleness.

Figure 5:
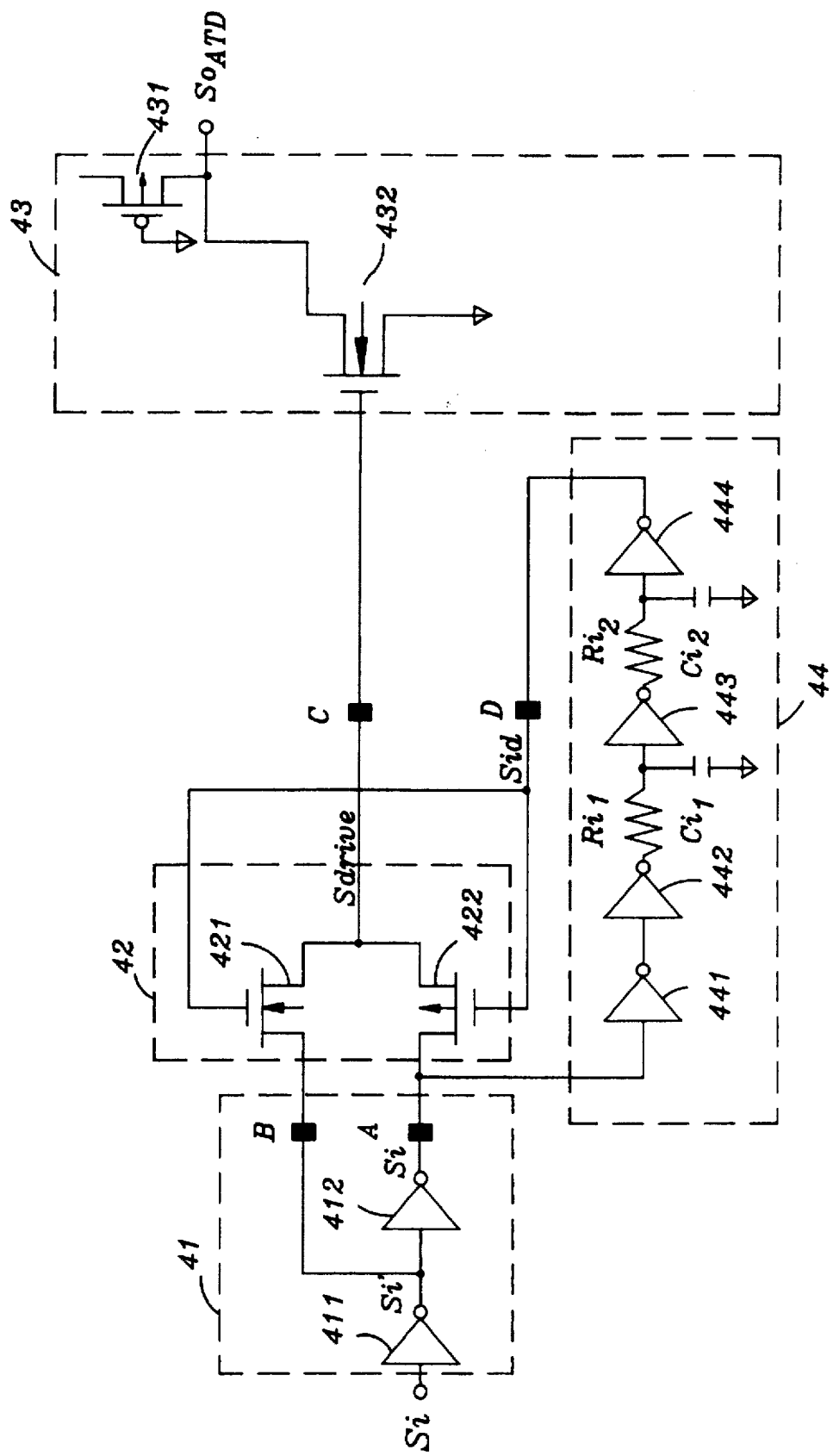
FIG. 5 represents the circuit diagram of the improved ATD circuit according to FIG. 4.

FIG. 5 illustrates a detailed circuit diagram of an improved ATD circuit according to FIG. 4. The inputting unit 41 includes 2 inverters 411 and 412. The inverter 411 generates the inverting signal Si' and the inverter 412 inverts Si' back to Si. The delaying unit 44 applies the conventional delay circuit by using 2 resistors $Ri_1$ and $Ri_2$ and 2 capacitors $Ci_1$ and $Ci_2$ to form 2 R-C circuit. The delaying effect is achieved also by using the characteristic that the charging and/or discharging of a capacitor must cost a great deal of time. Transferring unit 42 includes an NMOS transistor 421 and a PMOS transistor 422 with their gates tied together to receive the delayed signal $Si_d$; the source of the transistor 421 connects with the output of the inverter 411 to receive the inverting signal Si', but the source of the transistor 422 connects with the output of the inverter 412 to receive Si; both drains of the transistors 421 and 422 are coupled together to provide a driving signal $S_{drive}$ (in fact, the transferring unit 42 is just a transfer gate). In the driving unit 43, it is constructed as a NOR plane by using a PMOS transistor 431 to be the active load of an NMOS transistor 432, and the NOR plane is capable of sharing by all input pins of the chip. Again, 4 check points A (Si), B (Si'), C ($S_{drive}$), and D ($Si_d$) are chosen for showing their current logic states.

It is obvious that fewer transistors are used in the present invention than traditional ATD circuit. The inputting unit 41 needs 4 transistors (there is 2 MOS transistors in a CMOS inverter), and 2 MOS transistors are needed in the transferring unit 42. In other words, only 6 transistors are required to construct a new ATD circuit. Furthermore, only the first inverter 411 of the inputting unit 41 must consume DC current. In other words, the improved ATD circuit still consumes much less power dissipation than ever. In comparison with traditional ATD circuit according to FIG. 2., the transferring speed of the improved ATD circuit is almost the same as the conventional ATD circuit. In the conventional ATD circuit, it goes through 3 transistors in the testing unit 12; and in the improved ATD circuit, it also goes through 3 transistors from the happening of the address transition to the generating of the driving signal $S_{drive}$. Both the conventional and improved ATD circuits will cost a similar time while they drive a chip from sleeping. Clearly, there is almost no difference while compared with the speed between the conventional ATD circuit and the improved ATD circuit.

Figure 6:
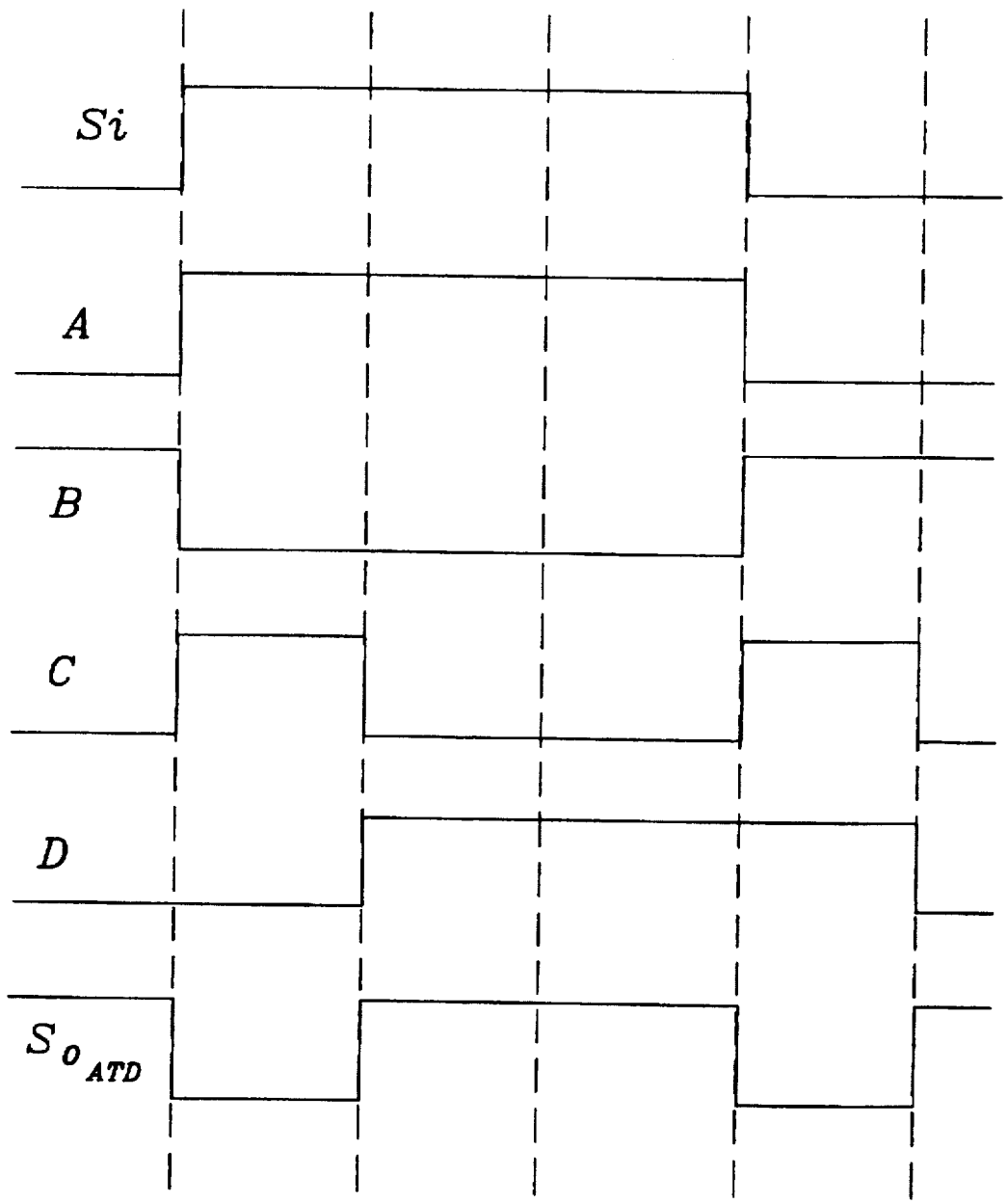
FIG. 6 represents the waveform diagram while a transition appears in a bit of an address according to FIG. 4.

Accompanying with the waveform in FIG. 6, the operations of the improved ATD circuit can be described more clearly. It is assumed that the initial state of Si, the point A, the point C and the point D are low, but the point B and the final output $So_{ATD}$ are high. When Si changes its state to high, the points A and C transit their states to high, the point B drops to low but the point D still remains on low. The delaying unit 44 delays the effect of Si in an operating period, and therefore, the state of point D still remains on low until the end of the operating period. The state of point B drops to low because the output of inverter 411 is low, and the point A is high because the output of inverter 412 is high. The transistors 421 is cut off but the transistor 422 is turn on by the low state of D ($Si_d$), this also pulls the state of point C to high. The transistor 432 is turned on by the high state of point C, and the final output $So_{ATD}$ drops to low for waking up the chip from idleness to process the operations indicated by the varied address.

At the end of operating period, the point A keeps on high, the point B is still low, the state of point D turns to high but the point C drops to low. The transistor 432 is cut off by the low state of point C, and the state of the final output $So_{ATD}$ is then pulled to high. It also terminates the operations of the task indicating by the address. The chip then goes idleness to wait another address transition.

When Si returns to low, the state of point D still remains on high, the point A drops to low, but the point B and the point C turn to high to indicate happening of an address transition. At the end of the operating period, the state of point A remains on low, both the point C and the point D drop to low, but the state of point B is pulled to high. Transistor 432 is cut off again by the low state of point C terminating the operating period and the operations of the task indicated by the address. The chip then goes idleness to wait another address transition (that is, another task's coming).

Figure 7:
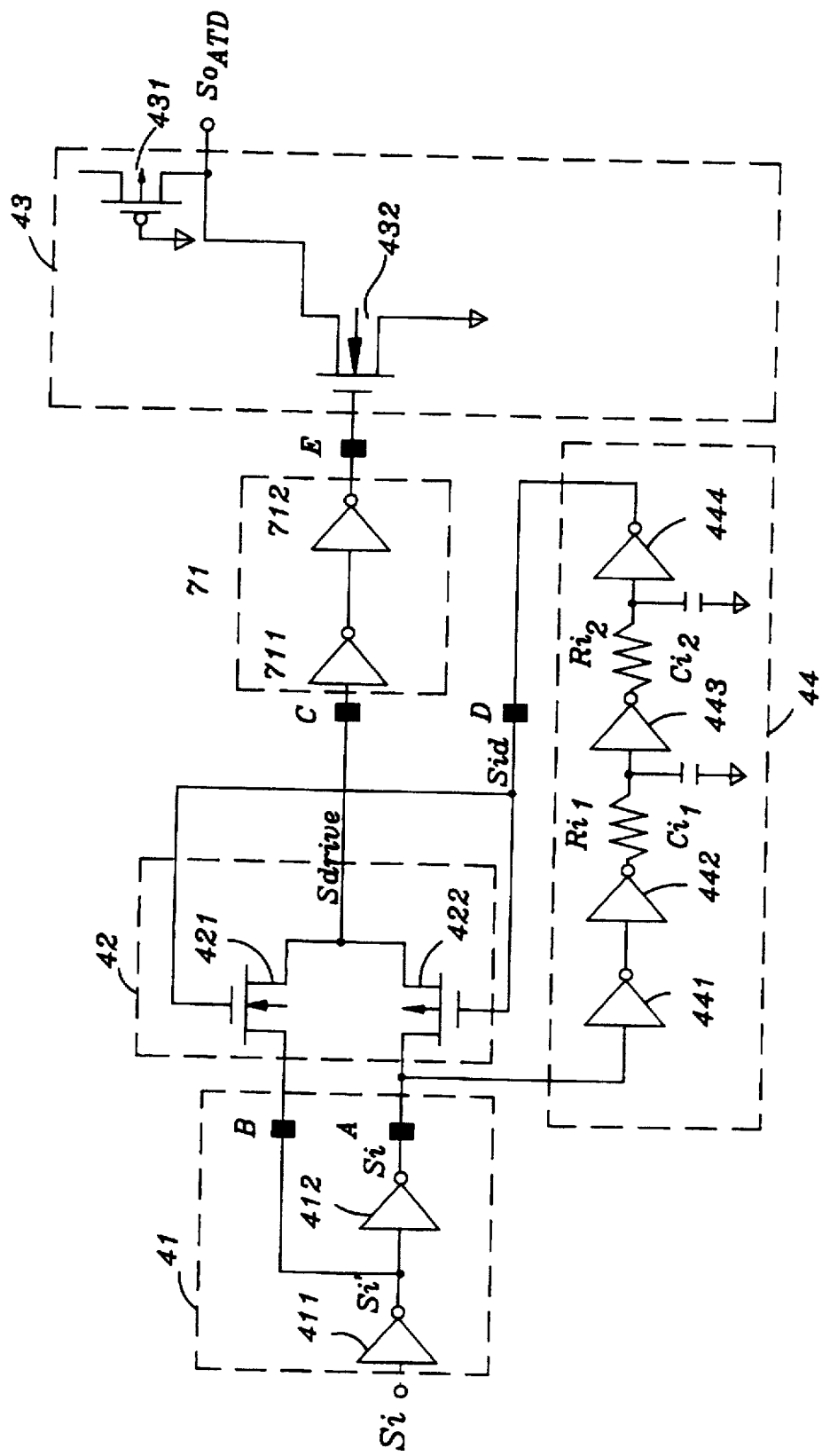
FIG. 7 represents an additional amplifier supplementing in the preferred embodiment.

Again, it is possible that several input pins of a chip switch their states simultaneously. However, the final output $So_{ATD}$ is still low even there are several driving signal $S_{drive}$ routing to the NOR plane but more transistors are turned on. In addition, the driving signal $S_{drive}$ can be amplified if necessary. FIG. 7 describes a simple example that a supplementing amplifier 71 constructed by 2 power amplifiers 711 and 712 is used to amplify the $S_{drive}$. The logic state of check point E is the same as the point C. However, more transistors are used in constructing the brand new ATD circuit, and the detecting speed is longer than before.

Figure 8:
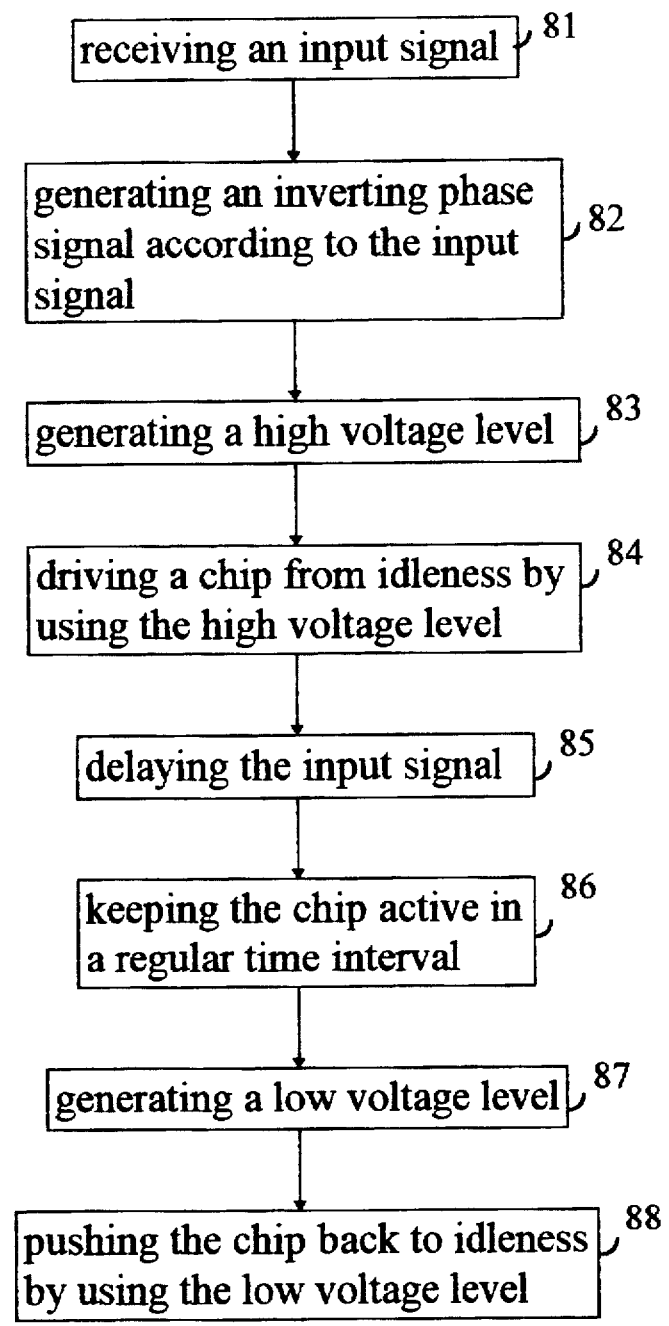
FIG. 8 is a flow chart for describing the operations according to the present invention.

FIG. 8 represents a flow chart summarizing the operations of the improved ATD circuit. First, each time when an input signal is arriving (step 81), an inverting phase signal based on the input signal is generated (step 82). A high level voltage (Logic 1) is then provided (step 83) to drive a chip from idleness (step 84). The input signal is delayed for beginning an operating period (step 85). The chip keeps wakefully in a regular time interval (operating period) to process the task indicating by the address (step 86) until the end of the operating period. A low voltage level (Logic 0) is then generated (step 87) to push the chip back to idleness (step 88). The chip will keep "sleeping" until next transition in the address.

As the present invention has been described with preferred embodiment, it will be obviously to those skilled in the art that various modifications may be made. These variations to the described embodiment of the present invention, the scope of which is limited by the following claims.

What is claimed is:

1. An address transition detection apparatus for reducing power consuming, wherein said apparatus comprises:
   inputting means responsive to an input signal for generating a pair of outputs including an inverted phase representation of said input signal and a non-inverted phase representation of said input signal;
   delaying means responsive to said non-inverted phase representation of said input signal for generating a delayed signal having a substantially same waveform as said input signal but appears after a regular time interval;
   transferring means responsive to said inverted phase representation of said input signal, said non-inverted phase representation of said input signal, and said delayed signal for generating a driving signal, said transferring means comprises:
      a first MOS transistor, having a gate, a drain, and a source, said source of said first MOS transistor receives said inverted Phase representation of said input signal;
      a second MOS transistor, having a gate, a drain, and a source, said gate of said second MOS transistor is coupled with said gate of said first MOS transistor to receive said delayed signal, said source of said second MOS transistor receives said non-inverted phase representation of said input signal, and said drain of said second MOS transistor is coupled with said drain of said first MOS transistor and outputs said driving signal; and
   driving means responsive to said driving signal for driving a chip from idleness.

2. The address transition detection apparatus according to claim 1, wherein said inputting means comprises:
   a first inverter receives said input signal for outputting said inverting phase signal; and
   a second inverter receives said inverting phase signal for reversing the phase of said inverting phase signal.

3. The address transition detection apparatus according to claim 2, wherein inverter is a CMOS (complementary MOS) inverter.

4. The address transition detection apparatus according to claim 1, wherein said delaying means further comprising a plurality of inverters, and the number of said plurality inverters is even.

5. The address transition detection apparatus according to claim 1, wherein said driving means further comprising:
   a driving MOS transistor having a gate, a drain, and a source, said gate of said driving MOS transistor receives said driving signal for driving a chip from idleness; and
   a loading MOS transistor having a gate, a drain, and a source, said source of said loading MOS transistor is coupled together with said drain of said driving MOS transistor.

6. The address transition detection apparatus according to claim 5, wherein said driving MOS transistor is a NMOS transistor.

7. The address transition detection apparatus according to claim 5, wherein said loading MOS transistor is PMOS transistor.

8. An address transition detection apparatus for reducing power consuming, said apparatus comprises:
   inputting means responsive to an input signal for generating a pair of outputs including an inverted phase representation of said input signal and a non-inverted phase representation of said input signal
   delaying means responsive to said non-inverted phase representation of said input signal for generating a delayed signal having a substantially same waveform as said input signal but appears after a regular time interval;
   a transferring means responsive to said inverted phase representation of said input signal, said non-inverted phase representation of said input signal, and said delayed signal for generating a driving signal, said transferring means comprises:
      a first MOS transistor, having a gate, a drain, and a source, said source of said first MOS transistor receives said inverted phase representation of said input signal;

a second MOS transistor, having a gate, a drain, and a source, said gate of said second MOS transistor is coupled with said gate of said first MOS transistor to receive said delayed signal, said source of said second MOS transistor receives said non-inverted phase representation of said input signal, and said drain of said second MOS transistor is coupled with said drain of said first MOS transistor and outputs said driving signal;

driving means responsive to said driving signal for driving a chip from idleness said driving means comprises:

a driving MOS transistor having a gate, a drain, and a source, said gate of said driving MOS transistor receives said driving signal: and a loading MOS transistor having a gate, a drain, and a source, said source of said loading MOS transistor is coupled together with said drain of said driving MOS transistor for driving said chip from idleness.

9. The address transition detection apparatus according to claim 8, wherein said inputting means comprises:

a first inverter receives said input signal for outputting said inverting phase signal; and a second inverter receives said inverting phase signal for reversing the phase of said inverting phase signal.

10. The address transition detection apparatus according to claim 9, wherein said inverter is a CMOS (complementary MOS) inverter.

11. The address transition detection apparatus according to claim 8, wherein said delaying means further comprising a plurality of inverters, and the number of said plurality inverters is even.

12. The address transition detection apparatus according to claim 8 wherein said driving MOS transistor is a NMOS transistor.

13. The address transition detection apparatus according to claim 8, wherein said loading MOS transistor is PMOS transistor.

14. The address transition detection apparatus according to claim 8, wherein said amplifying means further comprising a plurality of cascading power amplifiers.

15. A method for detecting an happening of an address transition, said method comprising the steps of:

generating apair of differential outputs according to an input signal, said pair of said differential outputs including an inverted phase representation of said input signal and a non-inverted phase representation of said input signal;

generating a high voltage level by using said inverted phase representation of said input signal and said non-inverted phase representation of said input signal;

driving a chip from idleness by using said high voltage level;

delaying said input signal by using said non-inverted phase representation of said input signal, said delayed input signal having a substantially same waveform as said input signal but appears after a regular time interval;

keeping said chip active in said regular time interval;

generating a low voltage level when said delayed input signal arrives; and said input signal is maintained in said regular time interval while said chip remains active changing said active chip back to idleness by using said low voltage level.

* * * * *